United States Patent [19]

Howard et al.

[11] 4,201,999

[45] May 6, 1980

[54] LOW BARRIER SCHOTTKY DIODES

[75] Inventors: James K. Howard, Fishkill; Frank E. Turene, Pleasant Valley; James F. White, Newburgh, all of N.Y.

[73] Assignee: International Business Machines Corporation, Armonk, N.Y.

[21] Appl. No.: 944,815

[22] Filed: Sep. 22, 1978

[51] Int. Cl.² .................... H01L 29/48; H01L 29/56; H01L 23/48
[52] U.S. Cl. ........................................ 357/15; 357/65; 357/67; 357/71
[58] Field of Search .................. 357/65, 67, 71, 15

[56] References Cited

U.S. PATENT DOCUMENTS

| | | | |
|---|---|---|---|
| 3,462,829 | 8/1969 | Lutz et al. | 357/65 |
| 3,537,174 | 11/1970 | May | 357/67 |
| 3,877,049 | 4/1975 | Buckley | 357/67 |
| 3,906,540 | 9/1975 | Hollins | 357/67 |
| 4,017,890 | 4/1977 | Howard | 357/67 |
| 4,056,642 | 11/1977 | Saxena et al. | 357/67 |
| 4,141,020 | 2/1979 | Howard et al. | 357/67 |
| 4,151,545 | 4/1979 | Schnepf et al. | 357/59 |

*Primary Examiner*—Andrew J. James
*Attorney, Agent, or Firm*—Henry Powers

[57] ABSTRACT

A low barrier Schottky Barrier Diode (SBD) utilizing a metallurgical diffusion barrier between a transition metal barrier contact and an aluminum base land pattern to prevent interaction therebetween. The diffusion barrier comprises a discretely formed layer of an intermetallic of the transition metal and aluminum.

4 Claims, 2 Drawing Figures

U.S. Patent        May, 6, 1980        4,201,999

LOW BARRIER SCHOTTKY DIODES

DESCRIPTION

Technical Field

This invention relates to semiconductor devices and, more particularly, to the use therein of semiconductor diodes of the Schottky Barrier type.

One object of this invention is to provide improved Schottky Barrier diodes.

Another object of this invention is to provide a Schottky Barrier diode with low barrier heights with improved stability to thermal cycling.

Another object of this invention is to provide low barrier height Schottky Barrier diodes for use in integrated semiconductor circuits.

Another object of this invention is to stabilize low barrier height Schottky Barrier diode utilizing a transition metal barrier contact and an aluminum based land pattern, in an integrated circuit, by use of a diffusion barrier comprised of an intermetallic of the transition metal and aluminum between the barrier contact, and positioned therebetween.

BACKGROUND ART

The use of Schottky barrier junctions is well known in the prior art, as well as the utilization of Schottky barrier devices in integrated monolithic circuits. Because of their relatively low forward barrier or turn-on voltage characteristics, they are found attractive for use in integrated circuits for applications such as preventing transistor saturation and to provide faster turn-on time for digital circuits, and faster switching speeds. Because the forward barrier height of these Schottky diodes is inversely proportional to such switching speeds, Schottky barrier diodes with lowered forward barrier heights are desirable.

Copending application Ser. No. 755,272 of J. K. Howard et al., filed Dec. 29, 1976 (assigned to the assignee of this application), describes a method for obtaining stable Schottky barrier diodes by reacting a transition metal barrier contact (e.g. hafnium, zirconium, tantalum, niobium, titanium, etc.) with overlying portions of an aluminum based conductor pattern to convert the barrier contact into an intermetallic of aluminum with the transition metal. Although the method of this application enables the production of stable Schottky barrier diodes having a forward barrier height of about 0.67 ev. (electron volts), lower barrier heights are desired, as for example that of about 0.5 ev as initially exhibited by tantalum as a barrier contact with silicon. Unfortunately, the use of aluminum land patterns with barrier contacts of the transition metals, particularly tantalum, is very limited in view of rapid and easy reaction between aluminum and some transition metals during temperature excursions, such as normally encountered in integrated circuit fabrication processes. These reactions (e.g. between tantalum and aluminum) form intermetallic compounds (e.g. $TaAl_3$) which shift the barrier heights to aluminum like values after high temperature excursions, e.g. from about 0.5 ev for tantalum as deposited on silicon to about 0.7 ev of aluminum after reaction. It would be desirable to retain stable low barrier height values as near as that exhibited by tantalum.

BRIEF DESCRIPTION OF THE DRAWINGS

In the accompanying drawings forming a material part of this disclosure.

DISCLOSURE OF THE INVENTION

Figure 1:
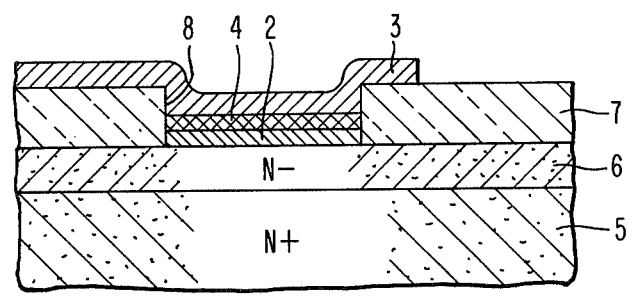
FIG. 1 is a fragmentary cross-sectional view of one embodiment of a Schottky barrier diode incorporating features of this invention.
Figure 2:
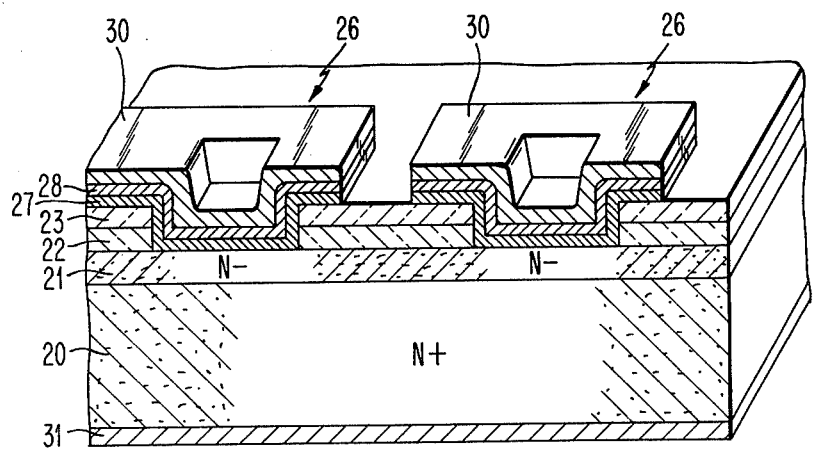
FIG. 2 is a schematic view in isometric of Schottky barrier diodes employed in evaluation of this invention.

For further comprehension of the invention, and of the objects and advantages thereof, reference will be had to the following description and accompanying drawings, and to the appended claims in which the various features of the invention are more particularly set forth.

As disclosed herein, a Schottky barrier diode 1 utilizing a transition metal barrier contact 2 and an aluminum based conductor pattern 3 is provided with thermally stable values of about 0.5 ev (e.g. up to about 500° C.) by use of an intermediate diffusion barrier 4 comprised of an intermetallic compound of aluminum and the transition metal of the barrier contact.

As utilized herein, the term "intermetallic compound" represents more than a simple mixture in the form of an alloy. Rather, the term refers to a substance composed of atoms of two different elements with definite proportions by atoms of the constituent elements, which may best be represented by a chemical formula. "Elements of Physical Metallurgy" by A. G. Guy, published by Addison Wesley (1951) on page 89 includes a definition of intermetallic compound as follows:

"Phases whose chemical composition are intermediate between the two pure metals and whose crystal structures are different from those of the pure metals. This difference in crystal structure distinguishes intermediate phases from primary solid solutions, which are based on the pure metal."

"Some intermediate phases can accurately be called intermetallic compounds when, like $Mg_2Pd$, they have a fixed simple ratio of the two kinds of atoms."

Table I

| ASTM Card No. (Vol. #1) | Crystal Structure | Reference |
|---|---|---|
| $Al_3Hf$ 17-419 | Tetragonal | Boller et al. Monatsh Chem. 91, 1174 (60) |
| $Al_3Ta$ 2-1128 | Tetragonal | Brauer, Z. Anorg. Chem. 242, 9 (1939) |
| $Al_3Zr$ 2-1093 | Tetragonal | Brauer, Z. Anorg. Chem. 242, 15 (1939) |
| $Al_3Ti$ 2-1121 | Tetragonal | Brauer. Z. Anorg. Chem. 242, 4 (1939) |
| $Al_3Ni$ 2-416 | Orthorhombic | Bradley et al., Phil. Mag 23, 1049 (37) |
| $Al_3Nb$ 13-146 | Tetragonal | Brauer, Z. Anorg. Chem. 242, 1 (1939) |

Table II

| Element | Structure |
|---|---|
| Al | Face Centered Cubic |
| Ta | Body Centered Cubic |
| HF | Hexagonal Close Pack |
| Zr | Hexagonal Close Pack |
| Ti | Hexagonal Close Pack |
| Nb | Body Centered Cubic |

Table II-continued

| Element | Structure |
|---|---|
| Ni | Face Centered Cubic |

Table I included hereinabove gives the intermetallic compound and its crystal structure with appropriate reference for that fact, and Table II also represented hereinabove, gives a corresponding crystal structure for the various pure elements involved in the present invention. Accordingly, it should be apparent that the intermetallic compounds of aluminum and the transition metals described herein are truly intermetallic compounds and not alloys. This is demonstrated by the fact that the crystal structures, i.e., the three dimensional relationships of atoms in the crystalline solid of these compounds, are different from those of the pure metals or alloys.

Best Mode for Carrying Out the Invention More specifically, the Schottky barrier diode 1, incorporating the feature of this invention, is formed in a semiconductor device comprised of a p or n type monocrystalline silicon substrate 5 on which is grown an epitaxial n or p type silicon semiconductive layer 6 (as for example with a doping level of about $3 \times 10^{16}$ a/cc) having dielectric layer 7 (e.g. silicon dioxide, $SiO_2$, silicon nitride, $Si_3N_4$, or sequential dual coating of $SiO_2$ and $Si_3N_4$) having an opening 8 which defines the area of the Schottky barrier diode.

A barrier contact layer 2 of a transition metal (such as tantalum, zirconium, titanium, hafnium, niobium, etc.) is formed in the dielectric opening 8 by an suitable method, such as by sputtering or evaporation. Although not critical, the transition metal layer 2 can typically be deposited in thicknesses of about 100 to about 1000 Å.

In the next operation, a 500 to about 1500 Å diffusion barrier layer 4 of an intermetallic of the transition metal and aluminum is formed over the barrier contact layer 2 by any suitable technique, preferably RF sputtering from a pre-alloyed target of the material, as for example, a pre-alloyed target of $TaAl_3$. However, it is to be understood that evaporation or co-deposition from two sources can also be used to prepare the intermetallic phase.

Excess portions of the diffusion barrier layer 4 and barrier contact 2 are then removed in conventional manner utilizing any of the well known wet and dry etching (e.g. reverse sputtering) techniques.

An aluminum based metal layer, as for example of about 5000 to about 10,000 Å thickness, is deposited, as by evaporation or sputtering, over the substrate, and suitably etched by either wet or dry techniques, into a pattern 3 for interconnecting the Schottky barrier diode with other devices of an integrated circuit, as for example one such as described in U.S. Pat. No. 3,900,344.

The intermetallic layer 4 forms an effective diffusion barrier preventing interaction between the transition metal barrier contact 2 and the aluminum based land pattern 3. The energy needed to effect diffusion of aluminum 3 and the transition metal 2 through the intermetallic phase barrier 4 is estimated to be about 1.5 to 2.0 ev which is substantially greater than the energy required to diffuse aluminum through aluminum grains (1.4 ev) or aluminum in aluminum grain boundaries (about 0.5 to 0.6 ev). It is expected that for high temperature excursion, e.g. to about 450° anticipated in processing such as glassing and solder joining operations (e.g. about 450° to 500° C.), aluminum will not penetrate the intermetallic layer 4, thus preserving the low barrier height of the transition metal barrier contact 2. Conversely, the diffusion of the transition metal is similarly restricted in aluminum, thus keeping the resistance of aluminum unaffected.

EXAMPLE 1

For this example, $TaAl_3$ was used as a diffusion limiting intermetallic layer between an elemental tantalum barrier contact and an aluminum contact. Three wafers were employed for fabricating test structures which were formed on an N+ semiconductor substrate 20 with an N− epitaxial layer 21 doped to a level of $3 \times 10^{16}$ atoms/cc. The epi layer 21 was sequentially coated with a $SiO_2$ layer 22 and a $Si_3N_4$ layer 23 patterned with openings 24 for forming diode test units 26. 240 test units were formed on a semiconductor wafer which was 2.25 inches in diameter.

A 500 Å thick film 27 of tantalum was RF sputter deposited on the wafer, followed by an intermetallic 1000 Å thick overcoating 28 of $TaAl_3$ which was RF sputtered from a pre-alloyed $TaAl_3$ target. Next, 8500 Å thick layer of an alloy of aluminum containing 4% copper was deposited by evaporation. The Al/Cu alloy layer was then photolithographically etched to form the diode anodes 30 of test units 26. This was followed by coating the backside of the wafers with a 5000 Å thick coating of the Al-4% Cu alloy to define ohmic contacts 31 to all three wafers.

To determine the effect of the growth in air of a native oxide on the initial tantalum surface on barrier properties, the vacuum of the sputtering unit was broken after the tantalum deposition and before the $TaAl_3$ deposition. Also, in one run, after tantalum deposition, the $TaAl_3$ was intentionally oxidized by ion bombardment of the $TaAl_3$ target for 5 min. in an argon atmosphere containing 10 vol% of oxygen.

The processing is summarized as follows:

Run 1—Ta/TaAl$_3$/Al-Cu, as in-situ deposition of Ta and TaAl$_3$, without breaking vacuum.

Run 2—Ta/B Vac/TaAl$_3$/Al-Cu, as vacuum broken after Ta deposition.

Run 3—Ta/Ox/TaAl$_3$/Al-Cu, as intentional oxidation of the TaAl$_3$ target with Ar+10% O$_2$ prior to the TaAl$_3$ deposition.

On completion of the fabrication, all three wafers were quartered and corresponding three quarter sections of the wafers were respectively sintered and heat treated at 400° C. for 1 hour, 450° C. for 1 hour, and 500° C. for 1 hour.

The electrical characterizations were determined from sixty SBD units per quarter wafer with average values set out in the tables below.

Table III

| | Run 1 (Ta/TaAl$_3$/Al—Cu) | | | |
|---|---|---|---|---|
| | As Deposited | 400° C. | 450° C. | 500° C. |
| Ideality Factor "n" (figure of merit) | 1.03 | 1.18 | 1.18 | 1.15 |
| Forward Barrier Height $\phi_B$, ev. | 0.592 | 0.442 | 0.472 | 0.510 |
| Series Resistance R$_2$, Ohms (silicon to aluminum) | 227 | 89 | 92 | 86 |
| Reverse Voltage V$_R$ volts at 10 | | | | |

Table III-continued

| | Run 1 (Ta/TaAl₃/Al—Cu) | | | |
|---|---|---|---|---|
| | As Deposited | 400° C. | 450° C. | 500° C. |
| microamps | 6.4 | 7.2 | 8.7 | 9.5 |

Table IV

| | Run 2 (Ta/B Vac/TaAl₃/Al—Cu) | | | |
|---|---|---|---|---|
| | As Deposited | 400° C. | 450° C. | 500° C. |
| "n" | 1.67 | 1.14 | 1.12 | 1.15 |
| $\phi_B$, ev. | 0.428 | 0.483 | 0.516 | 0.509 |
| $R_s$, ohms | 203 | 88 | 100 | 119 |
| $V_R$, volts at 10 microamps | 6.3 | 9.8 | 5.7 | 11.8 |

Table V

| | Run 3 (Ta/Ox/TaAl₃/Al) | | | |
|---|---|---|---|---|
| | As Deposited | 400° C. | 450° C. | 500° C. |
| "n" | 4.40 | 1.14 | 1.09 | 1.16 |
| $\phi_B$, ev. | 0.356 | 0.470 | 0.506 | 0.518 |
| $R_s$, ohms | 81Ω | 87Ω | 108Ω | 100Ω |
| $V_R$ volts at 10 microamps | 6.4 | 8.5 | 4.7 | 3.6* + 11.7* |

The foregoing tables show that all three TaAl₃ diffusion barriers withstood a 500° C. thermal stress for 1 hour, and maintained equality low forward Schottky barrier diodes.

EXAMPLES 2 and 3

For these examples, zirconium (Run 4) and titanium (Run 5) barrier contact films of 500 Å thickness were E-beam evaporated on separate silicon wafers, followed by RF sputter deposition of a 1000 Å diffusion film of TaAl₃ over each barrier contact of the separate wafers. An Al-4% Cu film of 8500 Å was then evaporated over each diffusion barrier followed by wet chemical etching into the test unit structure such as shown in FIG. 5. A back-side cathode was applied, by evaporation, after which the wafers were quartered, heat treated, and electrically characterized. Each quarter wafer contained sixty Schottky barrier diode test units 26.

The thermal cycles for the units were of one hour durations, in a furnace with a forming gas environment at temperature of 400° C., 450° C. and 500° C., with average values of all test units in each quarter set for in the tables below.

Table VI

| | Run 4 (Ti/TaAl₃/Al—Cu) Titanium Barrier Contact (Anode) | | | |
|---|---|---|---|---|
| | As Deposited | 400° C. | 450° C. | 500° C. |
| "n" | 1.68 | 1.32 | 1.43 | 1.41 |
| $\phi_B$, ev. | 0.416 | 0.453 | 0.433 | 0.434 |
| $R_s$, ohms | 54 | 54 | 62 | 53 |
| $V_R$ at $10^{-5}$ amps, volts | 2.1 | 2.8 | 1.5 | 3.1 |

Table VII

| | Run 5 (Zr/TaAl₃/Al—Cu) Zirconium Barrier Contact (Anode) | | | |
|---|---|---|---|---|
| | As Deposited | 400° C. | 450° C. | 500° C. |
| "n" | 1.81 | 1.20 | 1.12 | 1.26 |
| $\phi_B$, ev. | 0.423 | 0.462 | 0.467 | 0.446 |
| $R_s$, ohms | 42 | 47 | 51 | 40 |
| $V_R$, volts at $10^{-5}$ amps | 2.9 | 6.0 | 6.3 | 2.1 |

The fact that the barrier height, in Tables VI and VII above, remained below 0.5 ev. during all thermal cycles, indicates that the TaAl₃ intermetallic diffusion barrier prevented the Al-Cu alloy from reacting with either the Ti or Zr contacts. If there had been a reaction, the barrier height would have risen toward that of aluminum, e.g. about 0.7 ev.

The high ideality of the electrical parameters is attributed to lack of residual gas control during E-beam evaporation of the titanium and zirconium films.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

Having thus described our invention, what we claim as new, and desire to secure by Letters Patent is:

1. A schottky barrier contact on a silicon surface comprised of sequential layers of
   a transition metal adjacent said surface;
   an intermetallic compound of a said metal and aluminum; and
   aluminum.
2. The contact of claim 1 wherein said metal is tantalum.
3. The contact of claim 1 wherein said metal is selected from the group of Ta, Hf, Zr, Nb and Ti.
4. The contact of claim 3 wherein said intermetallic is an intermetallic compound of tantalum and aluminum having the formula TaAl₃.

* * * * *

UNITED STATES PATENT AND TRADEMARK OFFICE
CERTIFICATE OF CORRECTION

PATENT NO. : 4,201,999
DATED : May 6, 1980
INVENTOR(S) : James K. Howard et al.

It is certified that error appears in the above—identified patent and that said Letters Patent is hereby corrected as shown below:

Column 4, line 66, "$R_2$" should read -- $R_s$ --.

Signed and Sealed this

Twenty-fifth Day of November 1981

[SEAL]

Attest:

SIDNEY A. DIAMOND

Attesting Officer

Commissioner of Patents and Trademarks